US006888871B1

(12) United States Patent
Zhang et al.

(10) Patent No.: US 6,888,871 B1
(45) Date of Patent: May 3, 2005

(54) VCSEL AND VCSEL ARRAY HAVING INTEGRATED MICROLENSES FOR USE IN A SEMICONDUCTOR LASER PUMPED SOLID STATE LASER SYSTEM

(75) Inventors: Kaiyan Zhang, Belle Meade, NJ (US); Jiamin Zhang, Plainsboro, NJ (US); Chuni L. Ghosh, West Windsor, NJ (US); Laurence S. Watkins, Pennington, NJ (US)

(73) Assignee: Princeton Optronics, Inc., Mercerville, NJ (US)

( * ) Notice: Subject to any disclaimer, the term of this patent is extended or adjusted under 35 U.S.C. 154(b) by 491 days.

(21) Appl. No.: 09/615,065

(22) Filed: Jul. 12, 2000

(51) Int. Cl.[7] .......................... H01S 3/091; H01S 3/094; H01S 3/04
(52) U.S. Cl. .............................. 372/75; 372/36; 372/69; 372/70
(58) Field of Search ............................ 372/36, 69, 70, 372/75

(56) References Cited

U.S. PATENT DOCUMENTS

| 4,856,015 A | 8/1989 | Matsui et al. |
| 5,073,041 A | 12/1991 | Rastani |
| 5,359,447 A | 10/1994 | Hahn et al. |
| 5,455,836 A | 10/1995 | Li et al. |
| 5,483,511 A | 1/1996 | Jewell et al. |
| 5,488,619 A | 1/1996 | Injeyan et al. |

(Continued)

FOREIGN PATENT DOCUMENTS

| EP | 0523 861 A2 | 1/1993 |
| EP | 0653 824 A1 | 5/1995 |
| WO | WO 97/40558 | * 10/1997 ............ H01S/3/085 |

OTHER PUBLICATIONS

P. Laporta et al.; "Erbium–ytterbium microlasers: optical properties and lasing characteristics"; Jan. 1999.*
"Erbium–ytterbium microlaser; optical properties and lasing characteristics" by P. Laporta et al., *Optical Materials 11* (Jan. 1999) pp. 269–288.
"Experimental analysis and theortical modeling of a diode–pumped Er:Yb:glass micrpchip laser" by S. Taccheo et al., *OPTICS LETTERS*, Apr. 15, 1995, vol. 20, No. 8 pp. 889–891.
"Diode–pumped cw bulk Er:Yb:glass laser" by P. Laporta et al., *OPTICS LETTERS*, vol. 16, No. 24, Dec. 15, 1991.
Thibeault et al, "High–Speed Characteristics of Low–Optical Loss Oxide–Apertured Verical–Cavity Lasers," IEEE Photonics Technology Letters, IEEE Inc. New York, U.S. vol. 9, NO. 1, 1997 pp. 11–13 XP000640874.

(Continued)

*Primary Examiner*—Hoanganh Le
*Assistant Examiner*—Leith Al-Nazer
(74) *Attorney, Agent, or Firm*—Pillsbury Winthrop LLP (57) ABSTRACT

A vertical cavity surface emitting laser (VCSEL) device with improved power and beam characteristics. The VCSEL device contains one VCSEL or an array of VCSELs. Each VCSEL has a corresponding integrated microlens, and a heat sink is attached to the device side of the VCSEL device. The heat sink allows improved heat dissipation, and therefore provides improved power characteristics of the VCSEL device output laser beam. The microlens or microlens array allows easier and more compact focussing of the VCSEL device output laser beam. The VCSEL device can be used in a variety of optical systems, and its improved power and focusing characteristics provide a compact, low power, low cost laser system.

20 Claims, 5 Drawing Sheets

U.S. PATENT DOCUMENTS

| | | | |
|---|---|---|---|
| 5,495,494 A | | 2/1996 | Molva et al. |
| 5,513,204 A | | 4/1996 | Jayaraman |
| 5,538,919 A | * | 7/1996 | Lebby et al. |
| 5,654,228 A | | 8/1997 | Shieh et al. |
| 5,761,227 A | * | 6/1998 | Hargis et al. |
| 5,784,396 A | | 7/1998 | Guerin |
| 5,796,771 A | | 8/1998 | DenBaars et al. |
| 5,805,759 A | * | 9/1998 | Fukushima |
| 5,812,571 A | | 9/1998 | Peters |
| 5,831,960 A | | 11/1998 | Jiang et al. |
| 5,982,802 A | | 11/1999 | Thony et al. |
| 6,021,146 A | | 2/2000 | Jiang et al. |
| 6,021,147 A | | 2/2000 | Jiang et al. |
| 6,044,100 A | | 3/2000 | Hobson et al. |
| 6,121,983 A | | 9/2000 | Fork et al. |
| 6,122,109 A | | 9/2000 | Peake et al. |
| 6,376,269 B1 | * | 4/2002 | Chen et al. |

OTHER PUBLICATIONS

Chen, "A comparative Study on the Thermal Characteristics of Vertical–Cavity Surface–Emitting Lasers," Journal of Applied Physics, American Institute of Physics, New York, US, vol. 77, No. 9, May 1, 1995 pp. 4251–4258, XP000504592.

Du et al., "Directional Beam Control Using On/Off–Axis High–Efficiency Diffractive Optics Integrated On substrate–Emitting Vertical–Cavity Lasers" Conference on Lasers and Electo–Optics (CLEO), Baltimore, May 22–26, 1995, IEEE, U.S., vol. CONF. 15, May 22, 1995, pp. 195–196, XP002035656.

* cited by examiner

VCSEL AND VCSEL ARRAY HAVING INTEGRATED MICROLENSES FOR USE IN A SEMICONDUCTOR LASER PUMPED SOLID STATE LASER SYSTEM

FIELD OF THE INVENTION

The present invention relates to a vertical cavity surface emitting laser (VCSEL) having a device-side heat sink and integrated microlenses. Such a VCSEL can be advantageously used in a variety of communications systems, including a semiconductor laser pumped solid state laser system, and, more particularly, a light generating and emitting system for telecommunications and data communications applications in which a solid state laser is pumped by a VCSEL.

BACKGROUND OF THE INVENTION

Compact, low-cost and low-noise lasers are critical for the development of high performance analog photonics systems, such as fiber optic transmission systems. However, such lasers have not yet been satisfactorily developed.

For example, the use of externally-pumped solid state lasers to produce laser beams for fiber optic transmission is well-known. Such laser systems might include Er:Yb-doped glass microchip lasers, which are particularly useful for generating light beams having appropriate wavelengths for optical communications systems (i.e., 1530–1560 nm). However, such laser systems typically require the use of expensive or inefficient pumping mechanisms, such as flash lamps.

Diode lasers are known to be a relatively inexpensive and efficient pumping mechanism; however, such lasers are typically too low in power and beam quality to be effective in a wide range of applications. In particular, low-power vertical cavity surface emitting lasers (VCSELs), having a power output of approximately 2–5 mW, are known to be inexpensive and easy to produce. Moreover, VCSELs are well-suited for certain fiber optic applications, e.g., low-power transmissions over multimode fibers, due to the ease of matching the light emitted from the circular emitting facet of a VCSEL to a similarly-shaped core of a fiber optic cable.

However, conventional VCSELS, like edge-emitting diode lasers, are too low in power to effectively serve as a pumping mechanism for a doped-glass laser such as the Er:Yb laser referred to above. Moreover, output power of a single VCSEL cannot be increased effectively by increasing the size of the surface area of its emitting facet, due to poor heat dissipation properties of such a VCSEL. It is known to overcome this shortcoming by arranging multiple VCSELs into an array and including a heat sink attached to the device side of these VCSELs (as opposed to the substrate side). However, such high-power arrays of VCSELS were contemplated only in the context of optical ignition mechanisms. Finally, conventional laser systems including VCSEL devices typically require extensive use of external, discrete lens systems for effective utilization of the VCSEL output beams. The need to include and arrange such lens systems is responsible for an increase in system size and cost.

SUMMARY OF THE INVENTION

A VCSEL according to an embodiment of the present invention is a bottom-emitting VCSEL which achieves a high power output by including a heat sink on the device side, rather than on the substrate side, to thereby allow for improved heat dissipation. A plurality of these VCSELs can be arranged into an array, to further increase the total power output. In addition, refractive microlenses are integrated with the substrate of the VCSEL or VCSELs, and are used to decrease the divergence of the output beam(s), as well as to assist in focusing and/or collimating the beam(s) for a variety of communication applications. Thus, the need for costly and space-consuming external lenses is reduced.

The resultant VCSEL device can be compact and inexpensive, and yet produce a high-power, high quality output beam which can be effectively coupled to external optical elements.

The VCSEL device according to the present invention, and particularly the VCSEL device array according to the present invention, can advantageously be used as a pumping mechanism for a doped-glass laser, such as an Er:Yb-doped glass laser, to thereby provide a compact, low-cost, low-noise, high-power laser system.

The Er:Yb glass laser can also be used as the gain medium for a tunable laser, and the laser system according to the present invention, whether single-frequency or tunable, can be used in a wide variety of optical communication applications.

DETAILED DESCRIPTION OF PREFERRED EMBODIMENTS

Figure 1:
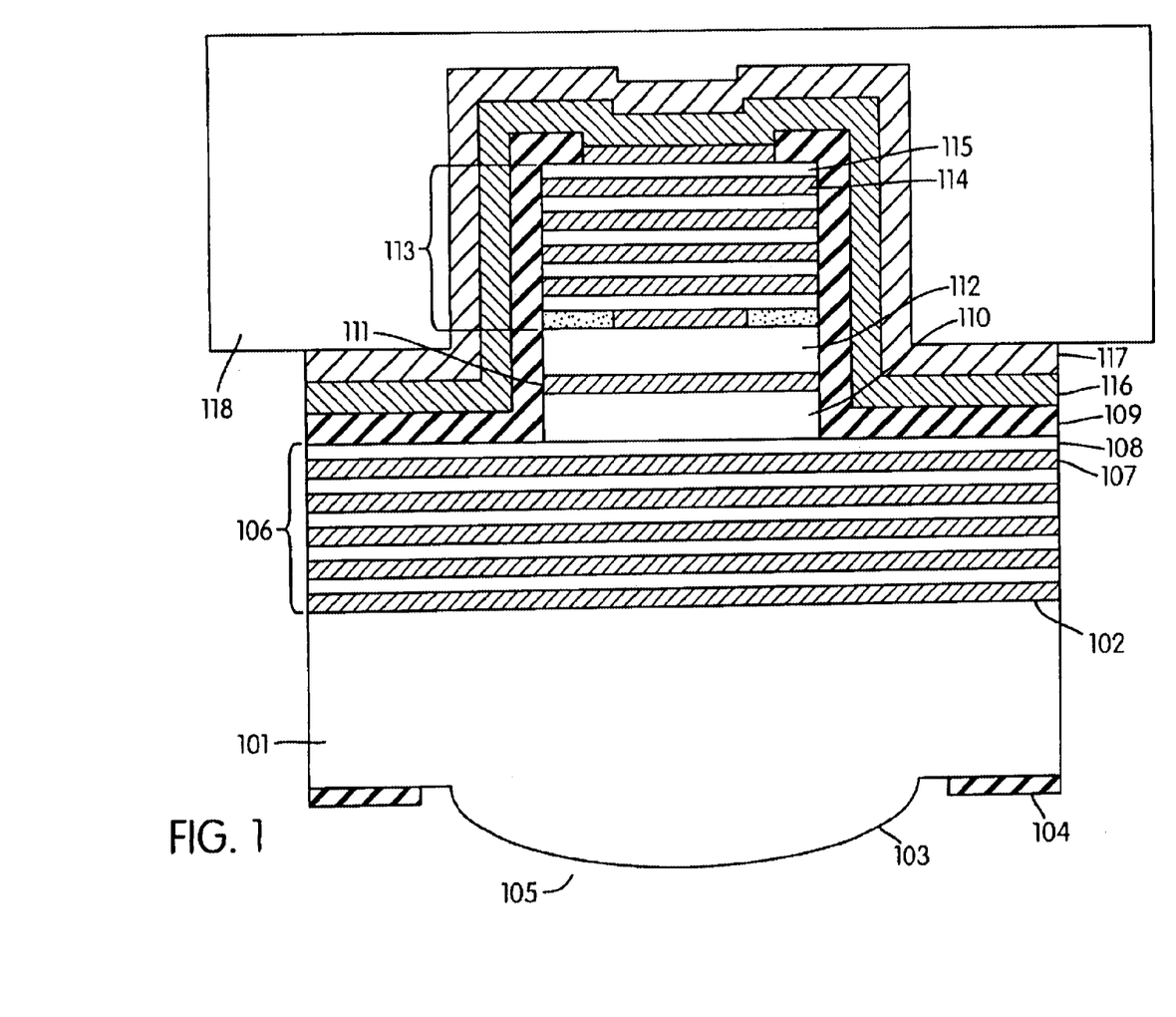
FIG. 1 is a sectional view of a single VCSEL device used in the present invention and having an integrated refractive microlens.

FIG. 1 demonstrates an exemplary embodiment of VCSEL 100 according to the present invention. VCSEL 100 comprises a substrate 101 of a suitable semiconductor material, on which the other materials of the VCSEL 100 can be grown, such as GaAs, Si, InP or the like. The substrate 101 has opposed inner and outer surfaces 102 and 103, and is preferably of N-type conductivity. N-ohmic contact layer 104 is deposited onto surface 103 and defines a region 105 through which light is emitted, as described below. Region 105 is coated with an antireflecting dielectric layer (not shown). On the inner surface 102 of the substrate 101 is a first mirror stack 106. The mirror stack 106 is a distributed Bragg reflector, and is formed of alternate layers 107 and 108 of semiconductor materials having different indices of refraction. This is achieved, for example, by using materials of different compositions, such as AlGaAs, in which the amount of aluminum in the material of the layers 107 is different from the amount of aluminum in the material of the layers 108. As is well known, the thickness and the specific compositions of the layers 107 and 108 determines the wavelength of the light emitted by the VCSEL. The material of the layers 107 and 108 of the first mirror stack 106 are of, for example, N-type conductivity.

On the first mirror stack 106 are insulator 109, which extends up and around the active layer 111, second mirror stack 113 of the VCSEL (described in detail below), and cladding 110, which, together with a second cladding layer 112, sandwiches active region 111. The active region 111 is undoped. The active region 111 may be of a well-known quantum well structure, or a multi-quantum well structure. The thickness of the active region may be, for example, half of the emitting wavelength or one emitting wavelength.

A second mirror stack 113 is above the active layer 111. The second mirror stack 113 is also a distributed Bragg reflector and, like the first mirror stack 106, comprises alternating layers 114 and 115 of materials having different indices of refraction. The layers 114 and 115 of the second mirror stack 113 may be of the same materials as those of the layers 107 and 108 of the first mirror stack 106. However, the layers 114 and 115 of the second mirror stack 113 are of an opposite conductivity to the layers 107 and 108 of the first mirror stack 106; e.g., here, layers 114 and 115 are of P-type conductivity. A contact layer 116 of a conductive material, such as a metal, is coated on the second mirror stack 113.

A heat sink body 118 of a disc of a thermally conductive material, such as diamond or a metal, is mounted on the contact layer 116 by a suitable bonding material 117, such as solder. Conventional VCSEL devices typically include heat sinks; however, these heat sinks are mounted on the substrate side of the VCSEL. Because of the thickness of the substrate (typically over 100 microns), heat from the VCSEL does not dissipate well. In contrast, the heat sink body 118 of the present invention removes heat more directly from the semiconductor materials of the VCSEL, and is therefore much more effective in preventing excessive heating of the VCSEL. This allows the VCSEL to be operated at significantly higher powers, in the range of at least 50–100 mW.

Additionally, outer surface 103 of the substrate 101 can be formed into a curved surface, for example, by chemical etching. This curved surface 103 forms a microlens for the light beam emitted by the VCSEL through the light-emitting window 105. For the single VCSEL device shown in FIG. 1, the microlens can reduce the beam divergence of the laser beam emitted from the VCSEL. Without this microlens, beam divergence of the VCSEL device would be approximately 10–15 degrees. However, the microlens of the present invention reduces beam divergence to approximately 0–1 degrees, and thereby allows for a smaller spot size, easier coupling to a fiber optic cable for transmission therethrough, etc. For certain applications, such as coupling for multimode fiber optic transmission, the above-described arrangement, including a microlens, can suffice, without any need for an external lens arrangement.

Figure 2A:
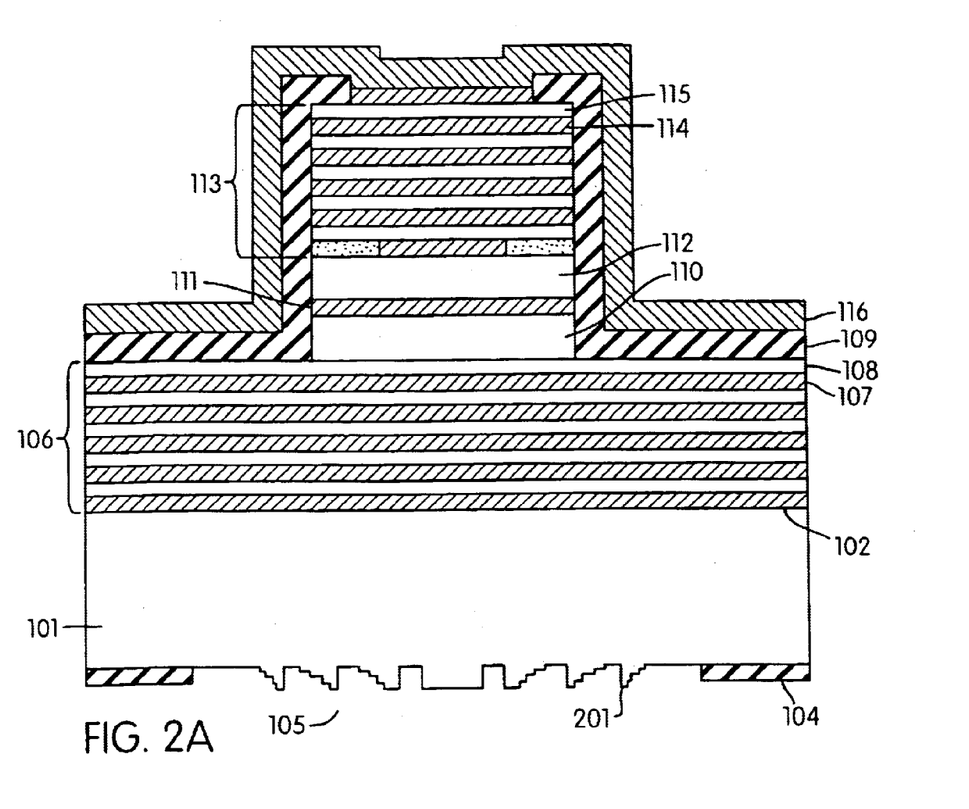
FIG. 2A is a sectional view of a single VCSEL device used in the present invention and having an integrated diffractive microlens for focussing the beam emitted by the VCSEL device.
Figure 2B:
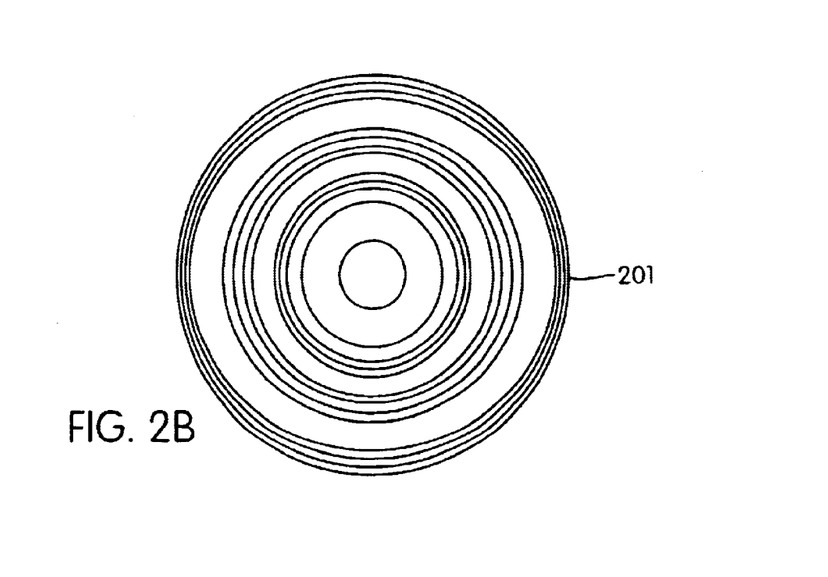
FIG. 2B is a bottom view of the VCSEL device shown in FIG. 2A.

Alternatively, as shown in FIGS. 2A and 2B (wherein like reference numerals refer to like parts shown in FIG. 1; also, note that bonding material 117 and heat sink 118 are not shown in FIGS. 2–4), the outer surface of the substrate 101 can be etched to form step surfaces 201 forming concentric circles, thereby providing a diffractive microlens. Such a microlens also allows direct focusing of the output beam of the VCSEL.

Figure 3:
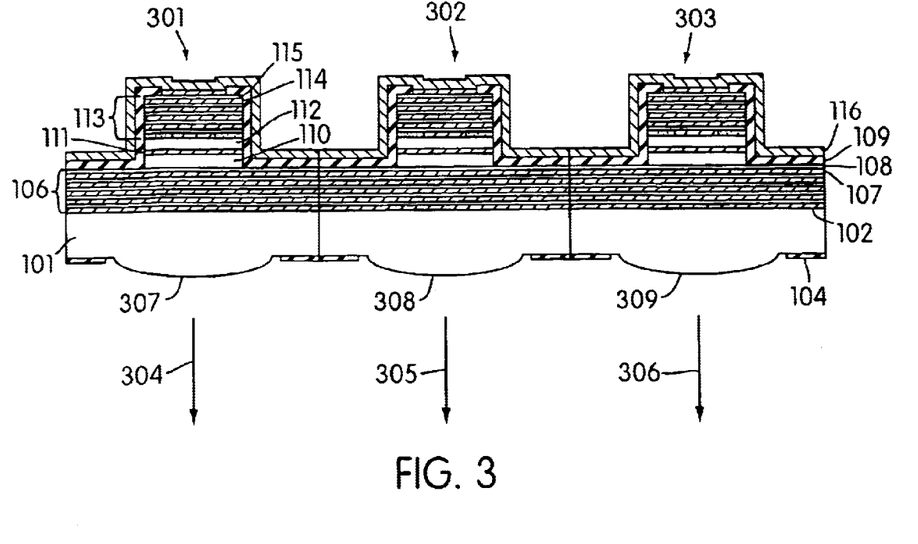
FIG. 3 is a sectional view of a typical VCSEL array which can be used in the device of the present invention and which contains integrated refractive microlenses for parallel beam output.

As shown in FIG. 3, a VCSEL array 300 may be formed using the VCSEL described in conjunction with FIG. 1 (wherein, again, like reference numerals refer to like parts shown in FIG. 1). Thus, VCSEL devices 301, 302 and 303 can be formed together as a VCSEL array, where each device respectively outputs beams of light 304, 305 and 306, to thereby cumulatively provide a VCSEL array output beam. Individual elements are formed by etching through the P-type layers, followed by dielectric passivation before the final interconnect metal layer is deposited for electrical contact. This forms an array of light emitting elements which are electrically biased in parallel through an N-type ohmic contact layer 104 on the substrate and a P-type ohmic contact layer 116 on the second mirror stack. A heat sink body, as shown in FIG. 1, can be mounted and secured onto the contact layer 116.

The outer surface 103 of the substrate 101 is formed into a plurality of individual microlenses 307, 308, 309 to form an array of the microlenses. A dielectric antireflecting coating layer (not shown) is deposited on the microlenses for efficient light emission. Light from each of the VCSEL devices of the array 300 will pass through a corresponding one of the separate microlenses 307, 308, 309.

When viewed from below, the array as described above can be arranged in a variety of shapes and sizes; for example, circular, rectangular or hexagonal. The size of the VCSEL device as described above can be, for example, as large as 150–200 microns, and the array size can be 100 or more. An array size of 6×6 can easily provide a total power output of approximately 1W.

As shown in FIG. 3, the refractive microlens array can be arranged to provide an output of parallel beams forming a composite beam. Thus, with a beam divergence of effectively <1 degree, focusing of these parallel beams (i.e., the composite beam) can then be easily achieved with a separate lens, if, for example, the array size is relatively large for a particular high-power application and additional focussing is needed, perhaps for coupling to a fiber optic cable having a relatively small numerical aperture. For a smaller power and array size, additional focussing might not be necessary, and so the beam(s) can be coupled directly into, for example, a wide-aperture, multimode fiber optic cable.

Figure 4:
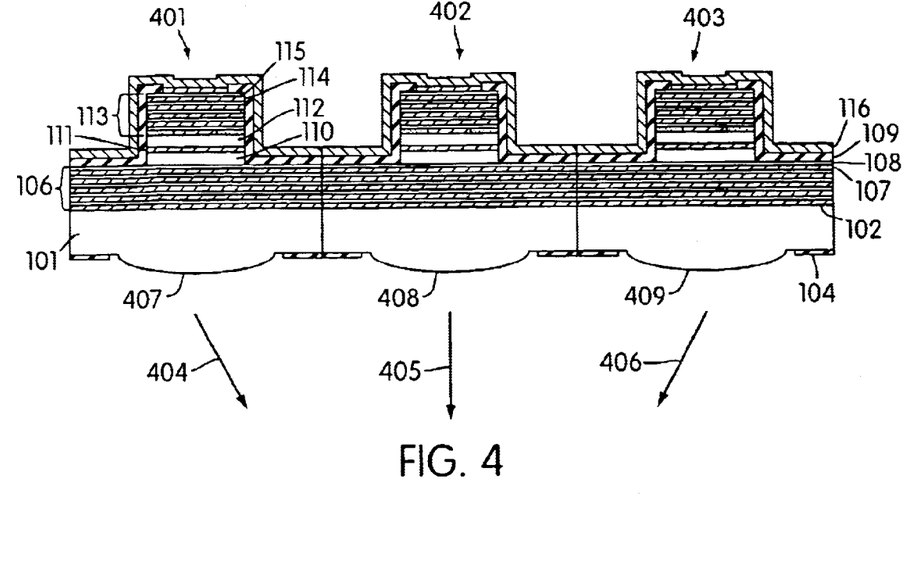
FIG. 4 is a sectional view of the array of VCSEL devices as shown in FIG. 3 and containing integrated refractive microlenses for convergent beam output.

As shown in FIG. 4, a refractive microlens array 400 having VCSEL devices 401, 402, 403 can be designed to result in an output of convergent beams 404, 405, 406 through microlenses 407, 408, 409. This arrangement effectively reduces the beam divergence of the beam output by the VCSEL array as a whole, and thereby allows, if necessary, easier and more effective focusing by external lenses. Particularly, external lenses can be offset from the output axis of a corresponding VCSEL within the VCSEL array, toward the direction of the center of the array, to thereby (progressively) focus the output beam of the array as a whole more effectively. This arrangement is particularly useful for coupling the output beam of the VCSEL to a single mode fiber for telecommunications applications. Note that in both of FIGS. 3 and 4, the vertical lines between VCSEL devices 301–303 and 401–403 are intended merely to illustrate conceptual separation points between the VCSEL devices, and are not intended to imply any literal or physical feature of the present invention.

A form of a laser system according to the present invention which makes use of the VCSEL and/or VCSEL array described above is generally designated in FIGS. 5 and 6 as 500. Laser system 500 comprises a housing 501 of a good thermally conducting material, such as copper or kovar, having an approximately rectangular shape The housing 501 comprises a flat base plate 502, and a pair of side walls 503 extending from the sides of the base plate 502. The housing 501 has back and front end walls 504 and 505 at the ends of the base plate 502. A cover 506 extends across and is secured to the side walls 503 and the end walls 504 and 505. Within the housing 501 and mounted on the inner surface of the back end wall 504 is a VCSEL 507 (which might include, for example, the structures shown in FIGS. 1–14). Note that the dimensions of a heat sink body 118 attached to VCSEL (array) 507 as described above (although not shown in FIG. 5) are substantially the same as the inner dimensions of the outer wall of the housing 501 so that the heat sink body 118 fits tightly within the housing 501.

Figure 5:
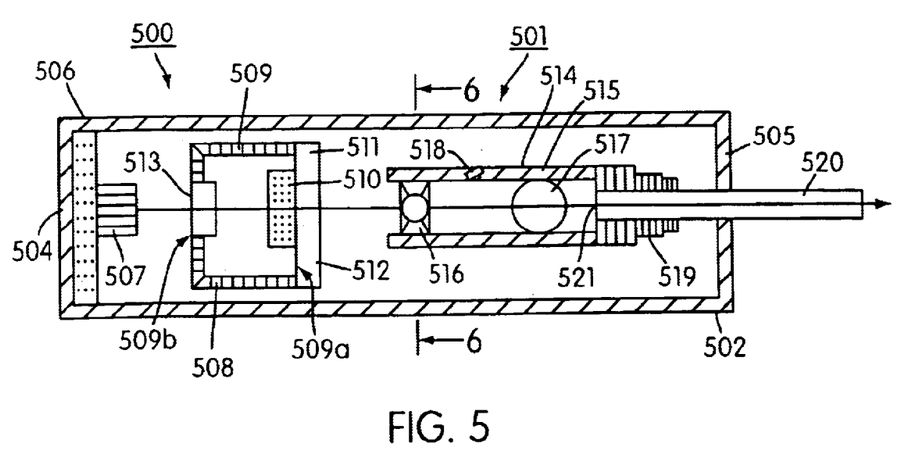
FIG. 5 is a top view of the optical device of the present invention with the cover of the housing removed.
Figure 6:
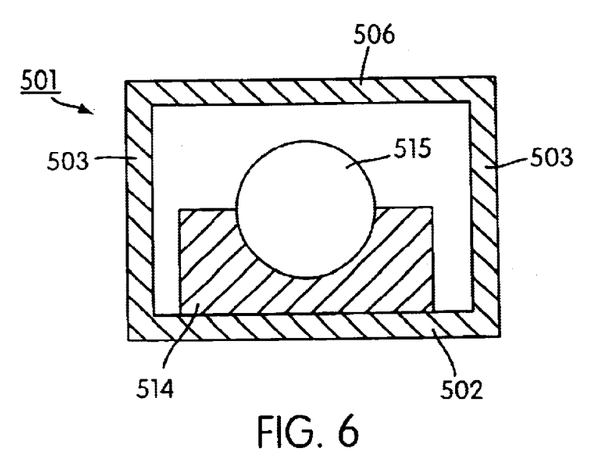
FIG. 6 is a sectional view taken along line 6—6 of FIG. 5.

Within the housing 501 and in front of the VCSEL 507 is a solid state microchip laser assembly 508. The solid state microchip laser assembly 508 comprises a mounting block 509 of a good heat conducting material which fits into the housing 501. The mounting block 509 has a recess 509a in its front surface and an opening 509b extending from the bottom of the recess 509a to the back of the mounting block 509. A microchip laser 510 is within the recess 509a in the mounting block 509. The microchip laser 510, which might be made of, for example, an erbium and ytterbium doped glass, is mounted on a mounting plate 511 of optically transparent and good thermally conducting material. The mounting block 509 may also be of a good thermally conducting metal, such as copper or kovar, and has an opening through which the light from the microchip laser 510 can flow. The mounting plate 511 extends across, and is secured to, the front of the mounting block 509. An optical filter 512 is. mounted across the front of the mounting plate 511. A lens 513 is mounted in the opening 509b in the mounting block 509.

In the operation of the optical device 500, an electric current is applied across the VCSEL (array) to generate light in the active layer(s) 111. The light is reflected back and forth in the active layer 111 between the first and second mirror stacks 106 and 113. However, the first mirror stack 106 will partially allow light to pass therethrough, so that the generated light will be back-emitted from the VCSEL through the substrate 101. The emitted beam of light is directed toward the doped glass laser disc 510 by way of lens 513. Thus, the. light beam emitted by the VCSEL is focused onto the glass laser disc 510, to thereby pump the glass laser disc 510 and cause it to generate and emit a beam of light.

Within the housing 501 and in front of the solid state microchip laser assembly 508 is an optical assembly 514. Optical assembly 514 includes a tubular mount 515, having an optical isolator 516 therein adjacent an end thereof, proximate to the assembly 508. An optical collimating lens 517 is also mounted therein and is proximate to an opposing end of the tubular mount 515. A photodiode 518 is in the wall of the mount 515 and is between the optical isolator 516 and the collimating lens 517. A plug 519 is in the other end of the mount 518 adjacent the collimating lens 517. Extending through the plug and mounted therein is a single mode optical fiber 520. The inner end 521 of the optical fiber 520 is in alignment with the collimating lens 517, so that it will receive light from the collimating lens 517 and serve as the output for the device 500. The optical fiber 520 extends through and is secured in an opening in the front wall 505 of the housing 500.

The beam of output light produced by the solid state laser disc 510, which is of a wavelength different from the wavelength of the light emitted by the VCSEL 507, is directed toward the filter 512. Although most of the light from the VCSEL 507 pumps the laser glass disc 510, some of the light from the VCSEL 507 passes through the glass disc 510 and is also directed toward the filter 512. The filter 512 is designed to allow the light beam emitted by the solid state laser 510 to pass therethrough, but to block any light from the VCSEL 507. Thus, only the light beam from the solid state laser 510 passes through the filter 512.

The beam of light from the solid state laser 510 then enters the optical isolator 516. The optical isolator 516 may be of any well-known construction which allows the beam of light from the solid state laser 510 to pass therethrough, but prevents any feedback of the light which may be reflected back by the other elements in the optical device 500. The light beam passing through the optical isolator 516, then enters the collimating lens 511. The collimating lens 517 directs the beam of light into the inner end 521 of the optical fiber 520. The light then passes out of the optical device 500 through the optical fiber 520 to carry out its desired purpose, such as for use in data communications or telecommunications. The photodiode 518 which is mounted in the mount 515 serves to monitor the output of the light beam emitted from the solid state microchip laser 510.

Importantly, the VCSEL array described above, when used in conjunction with the laser system just described, permits significant reduction in the size and cost of the laser system as a whole, when compared to similar conventional laser systems. Particularly, the increased power of the beam output by the VCSEL array (resulting from the heat sink 118) allows the use of VCSEL devices as laser pumps. As mentioned above, VCSEL devices are significantly cheaper, smaller and easier to produce than conventional pumping mechanisms. Furthermore, the use of integrated microlenses plays a role in reducing the size and cost of the laser system. In fact, the physical size of the VCSEL array, without the integrated microlenses discussed above, would present significant difficulties in implementation of a device similar to that shown in FIGS. 5 and 6. That is, if an external lens (or lens system) having a sufficiently short focal length is used as lens 513, collimation of the focused light proves difficult. If a longer focal length lens is used, collimation is improved; however, it becomes difficult to achieve a sufficiently small spot size at the glass laser disc 510, because of the divergence of the emitted light beam. Thus, although the use of a VCSEL array that does not include integrated microlenses might be theoretically possible in a configuration similar to that illustrated in FIGS. 5 and 6, such an implementation would be highly impractical in terms of size and difficulty.

These practical obstacles are easily overcome by the use of the VCSEL array having integrated microlenses described above. That is, the use of the disclosed array reduces or eliminates the need for arranging and using external lenses in pumping glass laser disc 510, and thereby significantly improves the cost, size and quality of the device as a whole. Notably, the arrangement referred to above, wherein the array of refractive microlenses serves to converge the VCSEL array output beam, and each lens in lens system 513 is offset from the axis of an output beam of a corresponding single VCSEL device, is particularly desirable for effective pumping of the glass laser disc 510.

Figure 7:
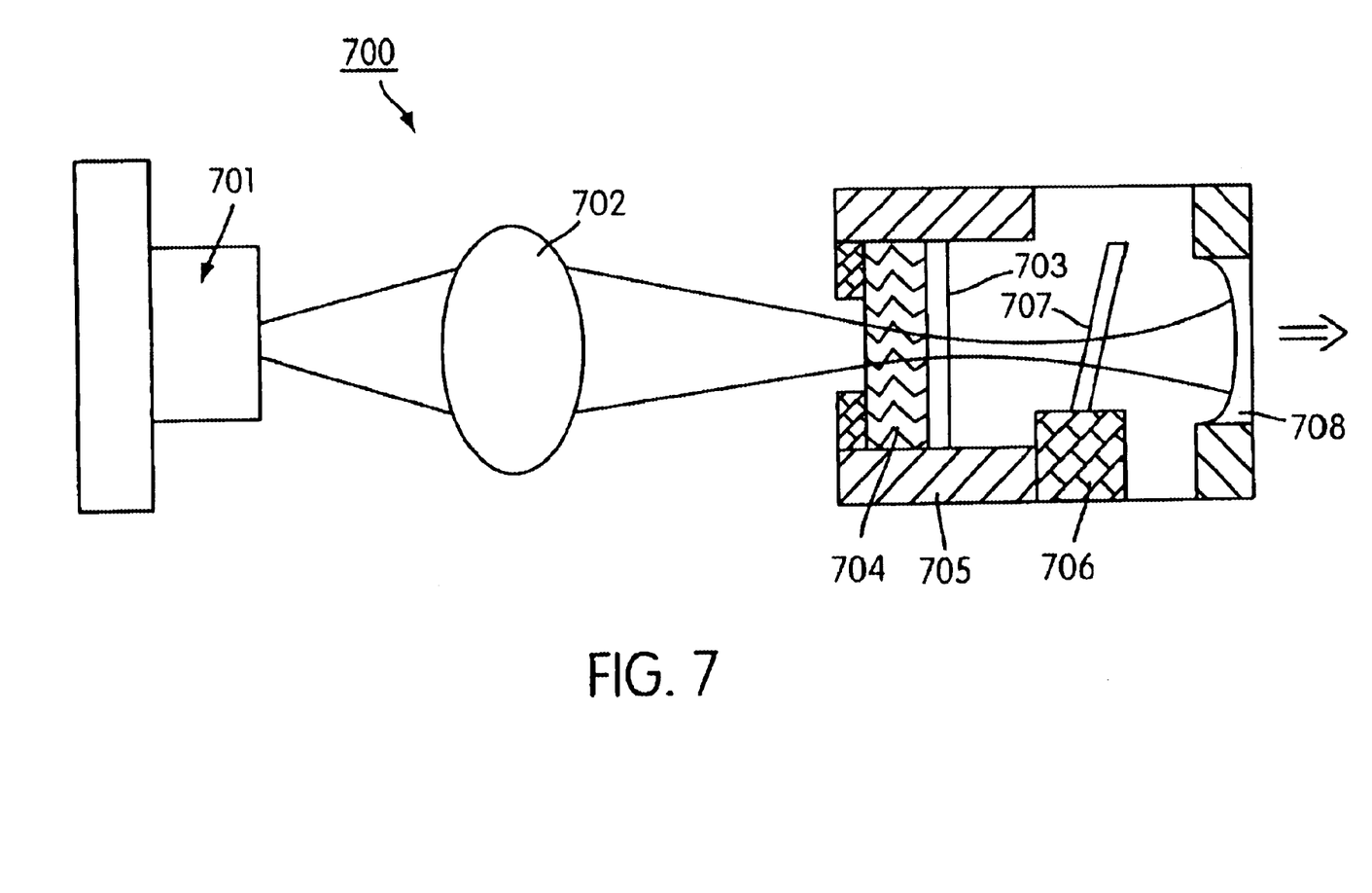
FIG. 7 is a schematic drawing of a tunable laser system according to the present invention.

Finally, referring to FIG. 7, there is shown another embodiment of an optical device of the present invention, which is designated 700 and which is designed to provide a tunable output beam. The optical device 700 is similar to the optical device 500 shown in FIGS. 5 and 6 in that it includes a VCSEL 701, which may be the same as the VCSEL 100 or the VCSEL array 300/400. The device 700 also includes a focusing lens 702 for focusing the light from the VCSEL 701 onto a solid state laser disc 703. The solid state laser disc 703 is similar to the solid state laser disc 510, but has different optical coating characteristics on both of its surfaces, and is bonded on a good thermal dissipating substrate 704 mounted on heat conducting sub-mount 705. Mounted in a mounting block 706 is an electrically or piezoelectrically driven thin etalon 707 or an electrically driven optical tunable filter. A laser output coupler 708 is also mounted on the mounting block 706. Thus, the wide wavelength tunable laser is comprised of the laser glass gain medium disc 703, such as erbium and ytterbium doped glass with suitable optical coatings on both surfaces, the wavelength selective device 707, such as thin etalon or tunable filter, and the optical coupler 708. The piezoelectrically driven thin etalon 707 or electrically driven tunable filter is adapted to provide wide wavelength tuning of the laser, in a wavelength range of, for example, 1530–1575 nm. The light from the output of the laser is directed into an optical fiber, not shown, in the same manner as shown in FIG. 5. Also, the optical device 700 is mounted in a housing, not shown, as is shown in FIG. 5.

Thus, there is provided by the present invention an optical device for providing a beam of light through an optical fiber for telecom or datacom purposes in which a VCSEL or a VCSEL array is used to pump a solid state laser. The solid state laser generates and emits a beam of light which is directed into the optical fiber. The VCSEL or VCSEL array includes a body of a semiconductor material mounted on a substrate, with the light generated in the semiconductor body being emitted through the substrate. The substrate has a lens or lens array formed along one surface which focuses/collimates the light emitted by the VCSEL. A heat sink, preferably of diamond or other good heat conducting material, is mounted on the side of the semiconductor body away from the substrate to conduct heat from the semiconductor body. The heat sink is mounted close to the portion of the semiconductor body in which the light is generated so as to provide improved cooling of the semiconductor body. This allows the VCSEL to be operated at higher bias to achieve greater power from the VCSEL.

Although the present invention has been described in conjunction with the above embodiments, it should be noted that these embodiments are designed only to illustrate, and not limit, the present invention.

What is claimed is:

1. A laser system comprising:
   a VCSEL pump source; and
   a doped-glass laser optically coupled with said VCSEL pump source to receive an output therefrom,
   wherein the doped glass laser comprises a doped glass disk having a highly refelective mirror coating on a first face and a partially reflective coating on an opposing, output face, the highly reflective mirror faces the VCSEL pump source and is arranged to be transmitting at a wavelength of the VCSEL pump source.

2. A laser system in accordance with claim 1, wherein said doped-glass laser is an Er:Yb doped-glass laser.

3. A laser system in accordance with claim 1, further comprising:
   a selecting means for selecting a desired wavelength of said output laser beam; and
   an optical coupler which partially reflects and partially transmits said output laser beam.

4. A laser system in accordance with claim 3, wherein said selecting means comprises an electrically or piezoelectrically-driven thin etalon.

5. A laser system in accordance with claim 3, wherein said selecting means comprises an electrically driven optical tunable filter.

6. A laser system in accordance with claim 1, wherein said VCSEL pump source comprises a VCSEL element.

7. A laser system in accordance with claim 6, wherein said VCSEL element comprises:
   a substrate having a microlens formed therein;
   a first mirror region, formed on said substrate;
   an active layer formed on said first mirror region;
   a second mirror region formed on said active layer; and
   a heat sink formed on said second mirror region.

8. A laser system in accordance with claim 7, wherein said VCSEL element further comprises:
   a contact layer on the second mirror region,
   a metal layer on a surface of the heat sink facing the second mirror region; and
   a bonding material which bonds the metal layer and the contact layer.

9. A laser system in accordance with claim 7, wherein a material of said heat sink is diamond.

10. A laser system in accordance with claim 7, wherein the microlens is a refractive or diffractive microlens, which reduces the divergence of the diode laser beam.

11. A laser system in accordance with claim 7, wherein the microlens is a refractive or diffractive microlens, which focuses the diode laser beam.

12. A laser system in accordance with claim 1, wherein the VCSEL pump source comprises a VCSEL array comprising a plurality of VCSEL elements arranged symmetrically on the substrate, each VCSEL element outputting an individual output laser beam so that the VCSEL array outputs a laser beam composed of individual output laser beams from said VCSEL elements, and further wherein each of said VCSEL elements comprises:
   a substrate having a microlens formed therein;
   a first mirror region, formed on said substrate;
   an active layer formed on said first mirror region;
   a second mirror region formed on said active layer; and
   a heat sink formed on said second mirror region.

13. A laser system in accordance with claim 12, wherein each microlens is a refractive microlens aligned on a primary axis of the individual output laser beams, and further wherein each microlens reduces the divergence of each of the individual output laser beams, to thereby reduce the divergence of the VCSEL pump source laser beam.

14. A laser system in accordance with claim 12, wherein each microlens is a refractive microlens aligned on a primary axis of the individual output laser beams, and further wherein each microlens converges the individual output beams to a central point, to thereby focus the VCSEL pump source laser beam.

15. A laser system in accordance with claim 14, further comprising external lenses which are offset from the primary axes of the individual output laser beams in a direction toward a center of the VCSEL array, to thereby progressively focus the VCSEL pump source laser beam.

16. A laser system in accordance with claim 12, wherein each microlens is a refractive microlens aligned on a primary axis of the individual output laser beams, and further wherein the microlenses reduce the divergence of the composite output beam of the VCSEL array to less than 1°, and thereby collimate the diode laser beam.

17. A laser system in accordance with claim 1, wherein said VCSEL pump source comprises a plurality of VCSEL elements arranged in a VCSEL array.

18. A method for generating and emitting a laser beam, comprising:
  generating a pump laser beam within a VCSEL pump source;
  emitting the pump laser beam from the VCSEL pump source through a microlens which is integrated within a substrate of the VCSEL pump source;
  focusing the pump laser beam onto a doped-glass laser with a lens system which comprises the microlens;
  pumping said doped-glass laser with said pump laser beam;
  generating an output laser beam within said doped-glass laser; and
  emitting said output laser beam,
  wherein the doped glass laser is a doped glass disk having a highly reflective mirror coating on a first face and a partially reflective coating on an opposing, output face, the highly reflective mirror faces the VCSEL pump source and is arranged to be transmitting at a wavelength of the VCSEL pump source.

19. A tunable laser, comprising:
  a semiconductor pump laser;
  a laser output coupler disposed proximate said semiconductor pump laser;
  a solid laser gain medium disposed between said semiconductor pump laser and said output coupler; and
  a tunable wavelength selective device disposed between said solid laser gain medium and said laser output coupler,
  wherein the solid laser gain medium is a doped glass disk having a highly reflective mirror coating on a first face, the highly reflective mirror faces the semiconductor pump laser and is arranged to be transmitting at the wavelength of the semiconductor pump laser,
  wherein said semiconductor pump laser pumps said solid laser gain medium substantially along a path coinciding with a light output path, from a side opposed to said light output side.

20. A method for generating a beam of light, comprising:
  pumping a solid laser gain medium with a VCSEL pump source along a pump direction, said gain medium being disposed within a laser resonant cavity; and
  selecting an output wavelength from a range of wavelengths from said laser resonant cavity,
  wherein said beam of light generated is substantially co-linear with said pump direction, on an opposing side of said solid laser gain medium, and
  wherein a tunable wavelength selective device is disposed in the resonant cavity, the tunable wavelength selective device is constructed to restrict the laser output to a wavelength from said laser cavity.

* * * * *